United States Patent [19]
Cirelli et al.

[11] Patent Number: 6,015,644
[45] Date of Patent: Jan. 18, 2000

[54] PROCESS FOR DEVICE FABRICATION USING A VARIABLE TRANSMISSION APERTURE

[75] Inventors: Raymond Andrew Cirelli, Hillsborough; Masis Mkrtchyan, Stirling, both of N.J.; Lee Edward Trimble, Orlando, Fla.; George Patrick Watson, Avon; David Lee Windt, Berkeley Heights, both of N.J.

[73] Assignee: Lucent Technologies Inc., Murray Hill, N.J.

[21] Appl. No.: 09/190,351

[22] Filed: Nov. 12, 1998

Related U.S. Application Data

[60] Provisional application No. 60/075,293, Feb. 20, 1998.
[51] Int. Cl.$^7$ ......................................................... G03F 9/00
[52] U.S. Cl. ................................................................ 430/30
[58] Field of Search ................................. 430/30; 355/67, 355/71

[56] References Cited

U.S. PATENT DOCUMENTS 5,452,054  9/1995  Dewa et al. ............................... 355/67

OTHER PUBLICATIONS

Cirelli et al., "Proceedings of the SPIE", *New Variable–Transmission Illumination Technique Optimized with Design Rule Criteria*, vol. 3334, pp. 395–405, 1998.
Ogawa, et al., "SPIE", *Challenges to Depth–of Focus Enhancement with a Practical Super–Resolution Technique*, vol. 2726, pp. 34–45.
Ogawa, et al., "SPIE", *The Effective Light Source Optimization with the Modified Beam for the Depth–of–Focus Enhancements*, vol. 2197, pp. 19–30.
Partlo, et al., "SPIE Optical/Laser Microlithography", *Depth of Focus and Resolution Enhancement for I–line and Deep–UV Lithography Using Annular Illumination*, vol. 1927, pp. 137–157, 1993.

*Primary Examiner*—Christopher G. Young
*Attorney, Agent, or Firm*—Richard J. Botos

[57] ABSTRACT

A process for device fabrication is disclosed. In the process, optical lithography is used to introduce an image of a desired pattern into an energy sensitive material. In the process, a filter element is provided. The filter element has at least two regions of different transmittance, each region denominated an aperture. The regions are selected by obtaining information about the desired pattern and an optical lithographic tool that will be used to introduce the image of the desired pattern into the energy sensitive resist material. A filter element that provides an image that, when developed, will provide features with dimensions within acceptable process tolerances is then designed. The filter element is designed by modeling the effects of each aperture of the filter element on the intensity profile of an image of the desired pattern. The combined effect of the apertures is then determined. If required, an aspect (transmittance, orientation, dimension) of the one or more of the proposed apertures is adjusted to provide a modeled intensity profile that more closely corresponds to the desired lithographic result. Once the aspects of all apertures is determined, the filter element is fabricated and used in the optical lithographic process by placing the filter element in the optical lithography tool.

11 Claims, 2 Drawing Sheets

PROCESS FOR DEVICE FABRICATION USING A VARIABLE TRANSMISSION APERTURE

CROSS-REFERENCE TO RELATED APPLICATION

This application claims priority of Provisional Application Ser. No. 60/075,293 which was filed on Feb. 20, 1998.

BACKGROUND OF THE INVENTION

1. Technical Field

The present invention is directed to a lithographic process for device fabrication and specifically to a process in which the wavelength of the exposing radiation is in the wavelength range of about 10 nm to about 350 nm.

2. Art Background

In projection lithographic processes for integrated circuit device fabrication, radiation is typically projected onto a patterned mask and the radiation transmitted through the mask (i.e. patterned radiation) is further transmitted onto a layer of an energy sensitive material formed on a substrate. Transmitting the radiation through a patterned mask thereby transfers an image of the mask pattern into the energy sensitive material. The image is then developed in the energy sensitive resist material and transferred into the underlying substrate. An integrated circuit device is fabricated using a series of such exposures to pattern different layers formed on a semiconductor substrate.

As technology advances, there is the need to provide more and more integrated circuit devices on a single chip. Consequently, the size of the individual devices on a chip are getting smaller (i.e., 0.5 $\mu$m to 0.35 $\mu$m to 0.25 $\mu$m to 0.18 $\mu$m, etc.). As the size of these devices (the device size is often referred to as the design rule) decreases, so does the wavelength of the radiation used to transfer the desired pattern into the energy sensitive material. Specifically, for design rules in the range of 0.35 $\mu$m to 0.18 $\mu$m, the wavelength of the exposing radiation is in the range of about 190 nm to about 350 nm (referred to as the "deep ultraviolet" or "deep-UV" range).

As noted in Ogawa, T., et al., "The effective light source optimization with the modified beam for the depth-of-focus enhancements" *SPIE,* Vol. 2197, pp. 19–30 (199?), one problem associated with the use of deep-UV radiation for lithography is the depth of focus of the desired image in the energy sensitive material. This is because, according to the Raleigh criterion, as the exposure wavelength gets shorter in order to obtain higher resolution, the depth of focus decreases. Ogawa et al. state that the maximum depth of focus for 0.35 $\mu$m, 0.30 $\mu$m, 0.25 $\mu$m, and 0.22 $\mu$m design rules are 1.50 $\mu$m, 1.20 $\mu$m, 0.80 $\mu$m, and 0.63 $\mu$m with 0.42, 0.48, 0.61, and 0.72 projection lens numerical aperture, respectively.

Ogawa et al. further observe that there is a limit on the achievable depth of focus using deep-UV radiation in conjunction with a conventional exposure. That limit is that an adequate depth of focus cannot be achieved for design rules smaller than 0.30 $\mu$m unless super resolution techniques such as off-axis illumination are used.

Several different super-resolution techniques have been proposed to improve the depth of focus that is achieved in deep UV lithography for design rules less than 0.35 $\mu$m. These techniques include off-axis illumination, phase shift masks, oblique illumination, ring illumination and quadrapole illumination. As noted by Ogawa et al., these super-resolution techniques are difficult to incorporate into a commercial process for device fabrication. Ogawa et al. propose a different technique referred to in that reference as modified beam illumination (MBI). The Ogawa et al. technique requires that the light from the radiation source (i.e., the KrF laser) be divided by a beam splitter and then overlapped again in a fly's eye lens. However, the Ogawa et al. technique requires a complex optimization process in which numerous exposures are made using a variety of light source profiles. The resulting images are then developed and analyzed to determine the light source profile that provides the desired process latitude (e.g. depth of focus) for the particular radiation source and design rules.

The difficulties of current super-resolution techniques are also described in Partlo, W. N., et al., "Depth of Focus and Resolution Enhancement for i-line and deep-UV Lithography Using Annular Illumination," *SPIE: Optical/Laser Microlithography VI* Vol. 1927, pp. 137–157 (1993). Partlo et al. observe that the problem associated with most of the off-axis illumination, super-resolution techniques is that they do not possess rotational symmetry. Therefore, according to Partlo et al., the off-axis super resolution techniques that do not possess complete rotational symmetry will exhibit degraded performance for some set of feature orientations. Partlo et al. describe the use of annular illumination to improve the depth of focus in deep-UV lithography because annular illumination provides complete rotational symmetry.

Accordingly, a method for improving the depth of focus and other lithographic parameters for exposures in lithographic processes for device fabrication is desired.

SUMMARY OF THE INVENTION

The present invention is directed to a lithographic process for device fabrication. Specifically, in the lithographic process a deep ultraviolet radiation source or extreme ultraviolet (EUV) radiation source is used to transfer the image of a desired pattern into an energy sensitive resist material. For the purposes of the present invention, deep ultraviolet (deep-UV hereinafter) radiation is radiation in the wavelength of about 190 nm to about 350 nm and EUV radiation is about 10 nm to about 14 nm. In the process of the present invention, radiation is projected from a radiation source through a filter element that varies the illumination or intensity profile of the radiation transmitted through the element. The radiation is directed onto a mask or reticle and proceeds through an objective system and onto a substrate with a layer of energy sensitive material thereon. The radiation incident on the energy sensitive material transfers an image of the mask or reticle into the energy sensitive material. That image is subsequently developed to form a pattern. The pattern is then transferred into the underlying substrate.

The filter element has a plurality of apertures therein. Apertures, as used herein are regions in the element through which at least some of the radiation incident thereon is transmitted. Consequently, the transmittance of an aperture can vary from greater than zero to one hundred percent. The placement and transmittance of the apertures are selected to provide an image with the desired lithographic characteristics (e.g. depth of focus, resolution, etc.). This is accomplished by first evaluating the desired pattern. In the context of lithographic processes for device fabrication, the pattern is the dimensions, configuration and placement of device features on the substrate. Typically the pattern contains a plurality of sub-patterns (e.g. a series of lines and spaces of a first pitch, a series of lines and spaces having a second pitch, some isolated lines, contact holes, etc.). Each unit of the pattern is typically referred to as a feature (e.g. an individual line in a series of lines and spaces is a pattern feature).

The configuration of the apertures and the transmittance of the apertures for the filter element is then selected by consideration of pattern information and information about the exposure tool or apparatus. In the context of the present information, pattern information includes feature size, feature shape, feature spacing, dimension control and pattern fidelity. Pattern fidelity, as used herein is the degree of correspondence between the desired dimensions and configuration of a feature and an actual feature. For example a desired feature has a square corner but the corner of the actual feature is somewhat rounded. The degree to which the rounded corner corresponds to the desired square corner is pattern fidelity. The exposure tool information that is used includes the numerical aperture (NA) of the optics in the tool, partial coherence, the wavelength of the exposing radiation, etc. Partial coherence is the ratio of the numerical aperture of the projection optics (projection on the mask) to the numerical aperture of the illumination optics (illumination from the mask).

Based upon the pattern information and the tool information, the lithographic parameters needed to obtain the desired pattern are then determined. In the context of the present invention, the lithographic parameters are parameters such as the required depth of focus and the resolution of the features in the pattern.

Based upon the pattern information, the filter element is divided into two or more regions of different transmittance. A model of the light that is transmitted through each individual region of transmittance is then generated using commercially available software such as SPLAT, which is available from the University of California at Berkeley. Based upon that information, an intensity profile (intensity as a function of position on the substrate) of the image that would result from an exposure using that single region of the filter element is obtained. This modeling is repeated for each individual region of transmittance in the filter element.

The intensity profiles that are modeled for each individual transmissive region in the filter element are then added together. The intensity profile is then compared with the lithographic parameters that correspond to the desired pattern. If the desired degree of correspondence is not observed, then the transmittance of one or more regions in the filter element is modified (e.g. from 100 hundred percent transmittance to forty percent transmittance). The modeled intensity profile is then compared with the desired lithographic parameters. This process is repeated until the modeled intensity profile corresponds to an acceptable degree with the desired lithographic parameters. One skilled in the art will appreciate that the degree of correspondence will depend upon the design tolerances of the process. For example, patterns that have larger, less densely packed features typically have higher tolerances than patterns with smaller, more densely packed features.

In one embodiment of the present invention, the filter element has a plurality of apertures and the transmittance of at least one of the apertures is greater than zero but less than one hundred percent (partial transmittance). The transmittance of the partially transmissive aperture is selected by first determining the intensity profile of radiation transmitted through the element. A relationship between at least one lithographic parameter associated with an image created by further transmitting that radiation through a mask or reticle and then onto an energy sensitive material is then determined. The transmittance of the aperture is based upon the correspondence between the desired lithographic parameter and the lithographic parameter associated with the image obtained using the element. Again, the requisite degree of correspondence is based upon the process tolerances.

DETAILED DESCRIPTION

Figure 1:
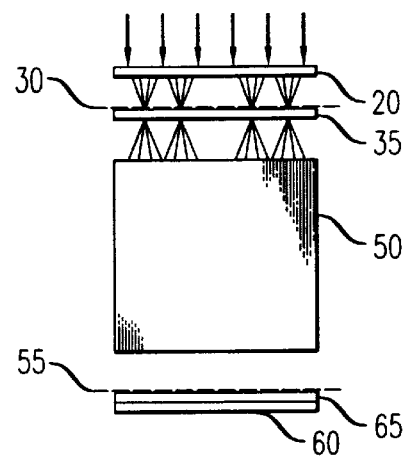
FIG. 1 is a schematic diagram of a projection lithography apparatus with an element that changes the intensity profile of the radiation used to illuminate the mask.

A projection lithography apparatus suitable for practicing the process of the present invention is illustrated in FIG. 1. The apparatus includes an element 20 and an objective imaging system 50. Light or radiation from a source for radiation is directed through the filter element 20 to the mask or reticle plane 30 where a mask or reticle 35 to be imaged is positioned. In one embodiment the radiation source is a KrF laser (wavelength of 248 nm). In a second embodiment the radiation source is an ArF laser (wavelength of 193 nm). Radiation that is transmitted through the mask or reticle 35 proceeds through the objective imaging system 50 to the wafer plane 55 in which lies a substrate 60 with a layer of energy sensitive material 65 formed thereon thereby forming an image of the mask or reticle 35 in the energy sensitive resist material.

In the process of the present invention, the filter element 20 has a plurality of apertures therein. Each of the apertures has a transmittance with respect to the radiation from the source that varies from greater than zero to one-hundred percent. The size, placement, geometry, and transmittance of the apertures is selected based upon the pattern in the mask or reticle, the desired lithographic parameters, and the numerical aperture and other characteristics of the lithographic apparatus.

Specifically, the present invention is used when the mask that is to be exposed has an irregular pattern thereon. Consequently, the images of such masks and the patterns developed therefrom have a corresponding irregularity. In the context of the present invention, an irregular pattern is a pattern in which the spacing and dimensions of the pattern features are not completely uniform. For example a pattern that consists of two or more different sub patterns (e.g. a series of regularly spaced lines and an isolated line) or features of different geometries or sizes is an irregular pattern.

The size, placement, geometry, and transmittance of the filter element apertures is determined by modeling the effect of a filter element with a selected number of apertures, each aperture having a size, placement, geometry, and transmittance, on the lithographic parameters of the process. This effect of the filter element is modeled by first modeling the individual effect of two or more regions of the filter element. The effect that is modeled is the intensity profile of a beam of light transmitted through an element having an aperture of a specified size, placement, geometry and transmittance. Conventional modeling tools that are commercially available are suitable for this purpose. One example of such software is SPLAT, which is available from the University of California at Berkeley.

The geometry and size of the two or more apertures in the proposed element are selected based on the type of subpatterns in the mask pattern. For example, if one of the sub patterns is a pattern of regular lines and spaces, an annular aperture produces an image with advantageous lithographic parameters. If one of the subpatterns is an isolated line, a circular aperture produces an image with advantageous lithographic parameters. If one of the patterns is a contact hole, a quadrapole aperture produces an image with advantageous lithographic parameters. Quadrapole apertures are described in Ogawa, T., et al., "The effective light source optimization with the modified beam for the depth-of-focus enhancements," *SPIE*, Vol. 2197, pp. 19–30 (199?) which is hereby incorporated by reference. These and other known relationships between aperture configurations and patterns are useful for selecting the geometry and size the apertures in the element.

After the model of the intensity profile for the radiation transmitted through each portion of the proposed filter element is obtained, the intensity profiles associated with each portion of the filter element are combined. This combined intensity profile models the intensity for the filter element as a whole. The combined intensity profile is then compared with the lithographic parameters of an image of the desired pattern. In making this determination, the numerical aperture and the maximum partial coherence of the proposed filter element are considered.

Since the pattern is irregular, it is advantageous to model the intensity profile of an image of each of the sub-patterns within the pattern. For example if the pattern contains both a series of regular lines and spaces and an isolated line, the intensity profiles for an image of each of these subpatterns using the proposed filter element are modeled. The modeled intensity profiles for each subpattern are then compared with the desired lithographic parameters. If the modeled intensity profiles indicate that an image with the desired lithographic parameters would be obtained for each subpattern, then the proposed filter element is used in the lithographic process for device fabrication. If the modeled intensity profiles do not indicate that an image with the desired lithographic parameters would be obtained using the proposed filter element, then the proposed filer element is modified by altering either the transmittance, placement, or configuration of one or more apertures in the proposed element. The process of modeling the intensity profile of an image from discrete portions of the modified element is repeated for the various subpatterns. The intensity profiles are then combined as described above and then compared with the desired lithographic parameters for the image. This process is repeated until the desired correspondence between the modeled intensity profiles from the filter element and the lithographic parameters associated with the desired image are obtained.

Figure 2:
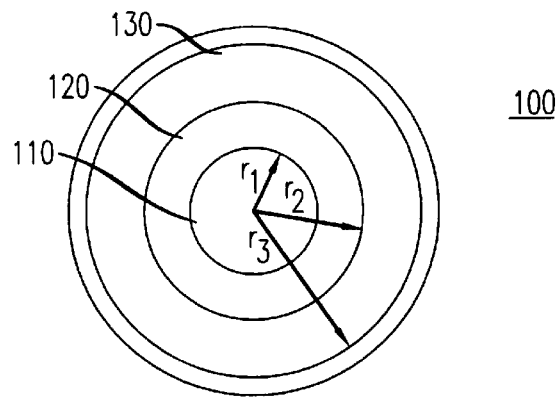
FIG. 2 is an illustration of one embodiment of an element for varying the intensity profile of the radiation used to illuminate the mask.

In one example of the present invention, elements with two different aperture configurations were evaluated. The first proposed element has three individual apertures. Referring to FIG. 2 that element 100 has three apertures, 110, 120, and 130 formed therein. Aperture 110 is circular and apertures 120 and 130 are ring-shaped.

Each aperture has an associated partial coherence and transmittance. The transmittance of each aperture is either the same or different as the other apertures, depending upon process requirements. For example, the second proposed filter element was the same as the element as described above except apertures 110 and 120 had the same transmittance and thus the combined apertures 110 and 120 had one associated range of partial coherence. Thus the second filter element was in essence a two-aperture element (one ring aperture and one annular aperture).

In this example, the lithography tool is a deep-UV lithography tool. The source of the exposing radiation is a KrF laser (wavelength ($\lambda$) equal to 248 nm). The numerical aperture of the tool was 0.53. The filter element was placed in axial symmetry with the imaging optics. The outer radius of aperture 130 corresponds to the maximum partial coherence of the deep UV lithography tool.

The transmittance of the regions 110, 120, and 130 were determined by modeling the intensity profiles of an exposure for a pattern of 0.25 $\mu$m lines and spaces of pitches varying from 500 to 1750. The aerial image for each individual aperture in the proposed filter elements, normalized to 100 percent transmittance, were obtained using the SPLAT software package. An intensity profile for each set of features (a set a features is a series of lines and spaces with a specified pitch) and each aperture was obtained. The dimensions of each region in the filter element was held constant from simulation to simulation. However, transmittance of the apertures was also varied and an intensity profile was modeled for each different transmittance and each set of features. In this example, the transmittance of each aperture was varied from zero to one-hundred percent in twenty percent increments. The intensity profile for the filter element was obtained by combining three intensity profiles: one for aperture 110; one for aperture 120; and one for aperture 130. Because the transmittance of each aperture was varied, there were numerous combined intensity profiles. The modeled intensity profile that corresponded most closely to the desired lithographic parameters (for a lithographic apparatus with a 248 nm light source and a 0.53 numerical aperture were selected.

The first filter element that was selected had an aperture 110 with a radius $r_1$ that corresponds to a partial coherence of 0.4 and a transmittance of 40 percent. Aperture 120 had an 80 percent transmittance and an outer radius $r_2$ that, along with an inner radius $r_1$, corresponds to a partial coherence range of 0.4 to 0.6. Aperture 130 has 100 percent transmittance and an inner radius $r_2$ and an outer radius $r_3$, which corresponds to a partial coherence range of 0.6 to 0.74. In this example, the lithographic apparatus has an optical system with a numerical aperture of 0.530 and a maximum partial coherence of 0.74. In the second filter element, apertures 110 and 120 had the same 40 percent transmittance and a radius that corresponds to a partial coherence of 0.6, and aperture 130 was the same as described above. The transmittances for the apertures described above were selected because the combined intensity profiles for each individual aperture in the filter element provided the best process window for each set of features in the pattern. One skilled in the art will appreciate that the radii of the apertures will depend upon the characteristics (e.g. NA, partial coherence) of the lithography tool in which the filter element will be used. One skilled in the art will readily determine the radii for the apertures based upon the specification of the partial coherence range for the aperture and the characteristics of the applicable lithography tool. For a circular aperture, the partial coherence range is specified by the maximum value alone, since the minimum value in the range is zero.

As shown in Table 1 below, the depth of focus of the various features in the pattern is affected by the apertures in the filter element. Specifically, the depth of focus for three types of features and the mean bias between isolated and dense features for the pattern are reported for four different elements. The first element is the element depicted in FIG. 2 wherein the transmittance of the aperture 110 is 40 percent, the transmittance of the aperture 120 is 80 percent, and the transmittance of the aperture 130 is one hundred percent. The second element is the element depicted in FIG. 3 with apertures 110 and 120 having a transmittance of 40 percent and aperture 130 having a transmittance of 100 percent.

The features designated as dense lines and spaces were lines with a 0.5 µm pitch. The isolated line had a pitch of 1.75 µm. Table 1 reports the depth of focus for both of these subpatterns using the above-described elements. The table also describes the depth of focus for all pitches if the above-described elements with the variable transmission apertures are used. The depth of focus for the various features that was obtained using the apertures of the present invention was compared with the depth of focus for those same features using 1.) a conventional element having three apertures, each having a transmittance of one-hundred percent; and 2.) a singular annular aperture having a transmittance of 100 percent and partial coherence in the range of 0.6 to 0.74. The depth of focus for the conventional and annular apertures is reported in Table 1 for the above-described dense lines and spaces, isolated lines, and for all pitches.

Figure 3:
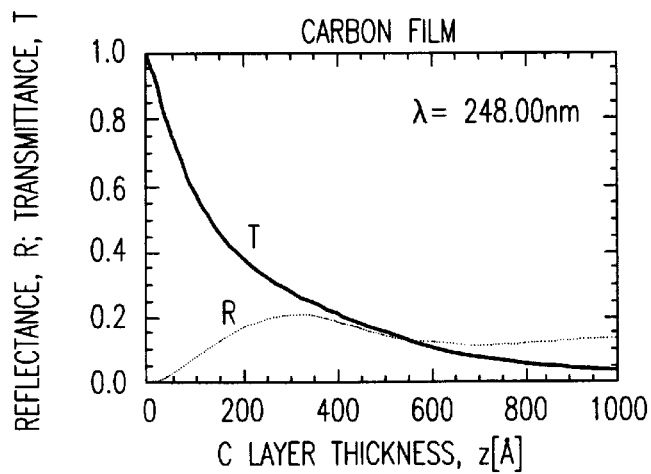
FIG. 3 illustrates the relationship between the thickness of a carbon film and the transmittance of 248 nm wavelength radiation therethrough.

The bias between isolated and dense features for the different depths of focus is also reported in Table 1 for the above-described filter elements. Table 1 demonstrates that an element that is designed according to the process of the present invention provides an image with a better average depth of focus for all subpatterns in the pattern than either the image provided using a conventional element with three regions of one-hundred percent transmittance each or an element with an annular element having a region of one-hundred percent transmittance.

obtain a filter element with the desired transmittance in regions 110, 120, and 130, a carbon film thickness of 17.5 nm was formed in region 110, a carbon film thickness of 5 nm was formed in region 120 and no carbon film was formed in region 130. The relationship between carbon film thickness and transmittance for a carbon film at 248 nm is illustrated in FIG. 3. The thickness of the film is adequately controlled by calibrating the deposition rate and choosing the deposition timing to achieve the desired thickness.

This filter element was then placed in axial symmetry with the projection optics of a GCA XLS deep-UV lithographic stepper with a 248 nm radiation source and a numerical aperture of 0.53. The first element was placed in the lithographic stepper relative to the projection optics in the manner illustrated schematically in FIG. 1.

A layer of energy sensitive material was then formed on a silicon substrate. The energy sensitive material was the photoresist known as ARCH2 (a positive tone deep-UV resist) which is obtained commercially from Olin Microelectronic Materials. The layer of energy sensitive materials had a thickness of about 760 nm. The material was baked at 130° C. for about 60 minutes. The substrate with the energy sensitive resist material was then placed in the GCA XLS lithographic stepper with the first element therein.

The mask used for the exposure was configured to project an image of a series of 0.25 µm lines and spaces of varying pitches onto the energy sensitive resist material. The pitches varied from 500 nm to 1750 nm. The stepper projected radiation through the first element, onto the mask, through the illumination optics onto the energy sensitive material. Several images of this series of features was introduced into the energy sensitive material. One image was created at a "best" focus. The best focus is the position of the substrate relative to the illumination optics (along the z-axis) that provided maximum contrast between the center line of an exposed region and the unexposed portion of the resist material. A second image was created with the substrate 0.4 microns closer to the illumination optics along the z-axis (i.e. the substrate was moved relative to the focal plane of the best focus). A third image was created with the substrate 0.4 microns further from the illumination optics relative to the focal plane of the best focus image. The energy sensitive

TABLE 1

| Element | Transparency % (per aperture) | Depth of Focus, µm[1] | | | Iso/Dense Bias Mean nm |
|---|---|---|---|---|---|
| | | Dense L/S | Isolated | All Pitches | |
| first element | 40, 80, 100 | 0.8 | 0.65 | 0.6 | 11 |
| second element | 40, 40, 100 | 0.7 | 0.7 | 0.7 | 19 |
| Conventional | 100, 100, 100 | 0.6 | 0.6 | 0.55 | 30 |
| Annular Aperture | 100 | 1 | 0.4 | 0 | 34 |

[1] For ± ten percent critical dimension (CD) variation

The above described first element was fabricated by forming a carbon film onto a fused silica substrate. A stencil mask is used to form the apertures on the substrate. Although the carbon film was deposited using DC magnetron sputtering in this example, any conventional technique for depositing the carbon film is contemplated as suitable. In this example, a 99.9 percent pure, planar carbon target was used. The target was rectangular and measured 20 inches by 3 inches. The sputtering atmosphere was 1.5 mTorr Argon. The power supplied to the target was 400 W. In order to material was then baked at 115° C. and developed using Olin 4262 developer solution.

Figure 4:
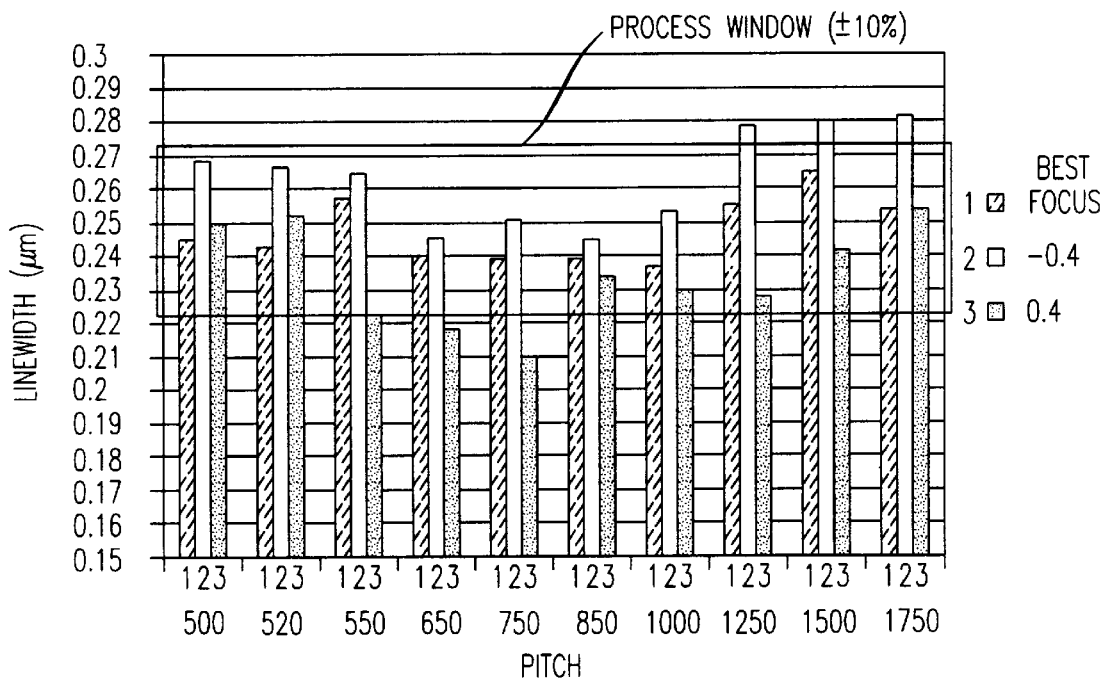
FIG. 4 illustrates the linewidth of features with different pitches developed from images obtained using the variable transmission aperture of the present invention.

For comparison, a second series of images was created without the filter element for comparison. FIG. 4 illustrates the dimension control for the exposures using the filter element of the present invention. For each set of features the linewidth at the best focus is reported. For each set of features, the linewidth at both +0.4 µm and −0.4 µm (position along z-axis relative to the best focus position) is also reported. The process window, as illustrated in FIG. 3 by the box 300, is a linewidth that is ±ten percent of the specified linewidth (0.25 μm). For virtually all lines of all pitches and all focus positions, the actual linewidth was within the acceptable process window 300. This indicates that extraordinary process flexibility was obtained using the above-described filter element. FIG. 4 demonstrates that the filter element provides the ability to obtain acceptable critical dimension control of different size features in a single exposure, not only at the best focus, but within a range of positions relative to the focal plane of the best focus image. This provides for enormous flexibility because the position of the wafer is adjustable within a certain range. Consequently, if a focus adjustment is needed to accommodate one type of feature in the pattern, that adjustment can be made without sacrificing acceptable critical dimension control of the other features in the pattern.

Figure 5:
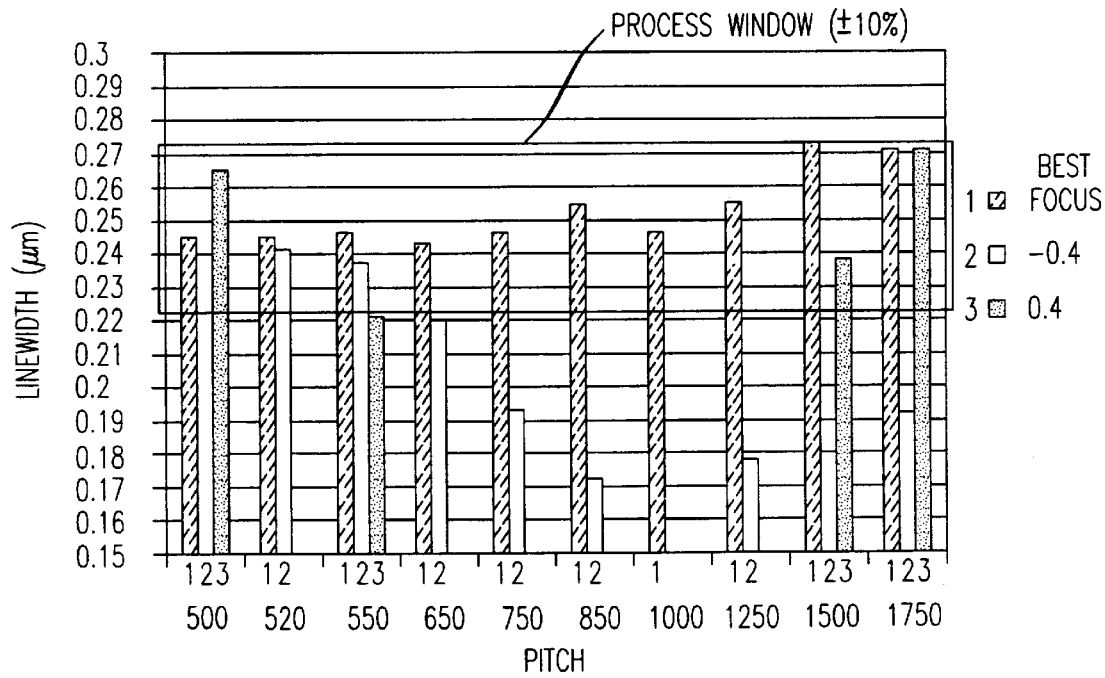
FIG. 5 illustrates the linewidth of features with different pitches developed from images obtained using conventional illumination (partial coherence of 0.74).

The advantages of the above-described filter element are readily apparent by comparing the images created with the element to the images of the same patterns created without the filter element. Referring to FIG. 5, the lines in the patterns developed from the "best focus" image were all within the acceptable process window for critical dimension control. However, very few of the lines in the patterns developed from the ±0.4 μm from "best focus" images were within the acceptable process window. Thus, the filter element of the present invention provides enormous flexibility to create non-uniform patterns in optical lithography with adequate critical dimension control. The flexibility results from the ability to adjust the focus of the illumination optics to accommodate certain features in the non-uniform pattern without sacrificing critical dimension control of the other features in the pattern.

What is claimed is:

1. A process for device fabrication comprising:
    projecting radiation from a radiation source through a filter element with a plurality of apertures therein wherein at least one of the apertures is a partially transmissive aperture that has a transmittance in the range from greater than zero to less than 100 percent;
    directing the radiation transmitted through the filter element onto a patterned mask through which is transmitted patterned radiation;
    directing the patterned radiation onto a layer of energy sensitive material, thereby transferring an image of the mask into the energy sensitive material; and
    developing a pattern from the image wherein the apertures in the filter element have a size and transmittance selected by:
        determining an intensity profile for the patterned radiation based upon the pattern;
        modeling the intensity of light transmitted through each aperture in the filter element individually;
        combining the intensity profiles and comparing the combined intensity profile with the intensity profile for the patterned radiation; and selecting aperture size and transmittance based upon the comparison.

2. The process of claim 1 wherein the radiation projected onto the filter element has a first intensity profile and the radiation transmitted through the filter element has a second intensity profile different from the first intensity profile.

3. The process of claim 2 wherein the intensity profile for the patterned radiation is determined based on pattern information selected from the group consisting of feature size, feature shape, feature spacing, dimension control, pattern fidelity, and combinations thereof.

4. The process of claim 3 wherein a lithographic exposure tool is used to project radiation onto the filter element, direct the radiation onto the patterned mask and direct the patterned radiation onto the layer of energy sensitive resist material and wherein the intensity of the light transmitted through the apertures in the filter element is modeled based upon information about the lithographic exposure tool, that information selected from the group consisting of the numerical aperture of the optics in the tool, partial coherence of the tool, the wavelength of the exposing radiation and combinations thereof.

5. The process of claim 4 further comprising determining lithographic parameters that provide the image with the desired intensity profile, wherein the lithographic parameters are selected from the group consisting of depth of focus of the image in the energy sensitive resist material, the resolution of the image in the energy sensitive resist material, and combinations thereof.

6. The process of claim 5 wherein the transmittance of the partially transmissive aperture is selected by determining the intensity profile of the radiation transmitted through the element; determining a relationship between at least one lithographic parameter and the intensity of the image introduced into the energy sensitive material and selecting a transmittance that, when used with the lithographic parameter, provides the desired image intensity.

7. The process of claim 1 wherein the filter element is a silicon substrate and the aperture having a transmissivity in the range of greater than zero to less than 100 percent is a carbon film formed on a portion of the silicon substrate.

8. The process of claim 1 wherein the filter element comprises two concentric apertures, a first aperture and a second aperture, each having a partial coherence and a transmittance, wherein the partial coherence and transmittance of the first aperture is different from the partial coherence and transmittance of the second aperture.

9. The process of claim 8 wherein the filter element is a fused silica substrate on which the first and second apertures are defined by a patterned carbon film formed on the fused silica substrate.

10. The process of claim 8 further comprising a third concentric aperture having a partial coherence and a transmittance that is different from the partial coherence of the first and second apertures.

11. The process of claim 10 wherein the filter element is a fused silica substrate on which the first, second and third apertures are defined by a patterned carbon film formed on the fused silica substrate.

* * * * *